United States Patent
Au et al.

(10) Patent No.: US 6,681,359 B1
(45) Date of Patent: Jan. 20, 2004

(54) SEMICONDUCTOR MEMORY SELF-TEST CONTROLLABLE AT BOARD LEVEL USING STANDARD INTERFACE

(75) Inventors: Johnie C. Au, Cupertino, CA (US); Sangeeta Thakur, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 476 days.

(21) Appl. No.: 09/633,689

(22) Filed: Aug. 7, 2000

(51) Int. Cl.$^7$ .............................................. G01R 31/28
(52) U.S. Cl. ...................................... 714/733; 714/727
(58) Field of Search ............................ 714/718, 30, 25, 714/726, 732, 733; 368/113; 365/201

(56) References Cited

U.S. PATENT DOCUMENTS

| | | | |
|---|---|---|---|
| 4,710,927 A | 12/1987 | Miller | 371/15 |
| 5,355,369 A | 10/1994 | Greenberger et al. | 371/22.3 |
| 5,543,730 A | 8/1996 | Cliff et al. | 326/38 |
| 5,568,437 A | * 10/1996 | Jamal | 365/201 |
| 5,742,617 A | 4/1998 | Warren | 371/22.31 |
| 5,751,163 A | 5/1998 | Tang et al. | 326/38 |
| 5,805,607 A | 9/1998 | Khu | 371/22.31 |
| 6,003,142 A | * 12/1999 | Mori | 714/30 |
| 6,327,224 B1 | * 12/2001 | Braceras et al. | 368/113 |
| 6,370,661 B1 | * 4/2002 | Miner | 714/718 |

OTHER PUBLICATIONS

*IEEE Standard Test Access Port and Boundary–Scan Architecture*, Copyright 1993 by the Institute of Electrical and Electronics Engineers, Inc.

* cited by examiner

*Primary Examiner*—Albert Decady
*Assistant Examiner*—Mujtaba Chaudry
(74) *Attorney, Agent, or Firm*—Kevin L. Daffer; Conley Rose P.C.

(57) ABSTRACT

A circuit, method and test architecture may be used for testing one or more integrated circuits that may be arranged upon a printed circuit board. Along with internal logic used by the integrated circuit during normal functioning, circuitry is included for built-in self-test. In an embodiment, the integrated circuits are semiconductor memories and include Memory Built-In Self-Test (MBIST) capability. A JTAG-compliant interface may be used to control the MBIST circuitry so that MBIST test modes can be selected by the JTAG Test Access Port controller, and MBIST test results can be written into boundary scan cells and scanned out through the JTAG Test Data Out port. The addition of a high-speed clock signal to the standard 4-wire JTAG interface allows full-speed operation of the MBIST circuitry. Therefore, the integrated circuit can be tested at full speed, and the test results scanned out by the slower JTAG clock. The use of the JTAG interface with MBIST allows multiple interconnected devices to be tested using a single interface. This is advantageous for in-circuit testing, since it is not necessary to directly probe each device to be tested. It also simplifies the use of automated test equipment, since the JTAG standard is widely used.

23 Claims, 5 Drawing Sheets

SEMICONDUCTOR MEMORY SELF-TEST CONTROLLABLE AT BOARD LEVEL USING STANDARD INTERFACE

BACKGROUND OF THE INVENTION

1. Field of the Invention

This invention relates to semiconductor memory device testing, and more particularly to an architecture and method for testing semiconductor memory devices, wherein each of the devices includes memory built-in self-test ("MBIST") circuitry. Described herein are means for integrating a standard test communications interface with the MBIST circuitry. This enhancement permits control of MBIST execution and export of MBIST test results via the communications port.

2. Description of the Related Art

Testing an integrated circuit can be performed in various ways. For example, the integrated circuit can be tested while in wafer form using test probe operation. Additionally, or alternatively, the integrated circuit can be tested after it is scribed and packaged. In either instance, sequential and/or combinatorial logic of the integrated circuit must be tested using input test data, generally referred to as "test vectors." Test vectors are supplied from a commercial test machine or Automated Test Equipment ("ATE"). Alternatively, the test vectors can be provided from circuitry upon the integrated circuit. Such circuitry is often referred to as built in self test ("BIST") circuitry. BIST circuitry may use a pseudo-random sequence generator to produce test vectors forwarded to the functional core logic of the integrated circuit.

As semiconductor technology has advanced, making possible higher levels of integration, device testability has become increasingly problematic. Semiconductor manufacturers have resorted to higher pin counts and smaller pin separations on device packages, in order to accommodate densely populated integrated circuits. It is no longer feasible in some cases to probe these integrated circuits externally, because of the minute physical dimensions of the package leads. Furthermore, device operating speeds have also increased to the point where loading and introduction of noise by external probes has become an important consideration.

An important development related to the testing of integrated circuits is built-in self-test (BIST) capability. BIST technology has arisen out of the need to test ever more complex integrated circuits, such as modern microprocessors. Traditional methods of testing rely on external test equipment, such as oscilloscopes and logic analyzers. Often, huge numbers of test cases must be evaluated to fully validate a sophisticated integrated device, and the amount of time required for a human tester to administer a full suite of tests becomes prohibitive. Automated Test Equipment (ATE) can often be employed to test such complex devices, but is expensive and time-consuming to set up. Therefore, the use of automated testers is largely limited to the production environment. Furthermore, for many high-performance integrated circuits, even an automated tester may not be feasible. For instance, some processors operate at such high clock rates that it is virtually impossible to maintain the integrity of data and control signals over the distance separating the IC and the tester. For these, and other reasons, much of the test functionality has been moved into the integrated circuit itself. The BIST circuitry may share the same die as the integrated circuit itself. Alternatively, the BIST circuitry may be on a different die, but within the same package as the circuit itself. With the test circuitry in such close proximity, the difficulty in monitoring and controlling high-speed signals is reduced. A simplified external tester communicates with the BIST circuitry, and has only to initiate tests and collect the results.

BIST has been used successfully in testing semiconductor memory devices. In this context, the term Memory Built-In Self-Test (MBIST) is often used. However, MBIST requires adding significant test circuitry to the memory device, as well as additional I/O pins on the device package dedicated to MBIST test functions. Also, MBIST is not intended for testing multiple interconnected devices. For example, in a board populated with several integrated circuits, each IC would independently run its own self-test, without communicating with its neighboring devices. This complicates testing, since the tester must directly interface with every one of the ICs.

It would be desirable to control BIST circuitry at the board level, using a standard interface, by means of which outcome (pass/fail) information and/or test findings, such as failure counts or bitmap failure locations, could be obtained from the BIST circuitry. Preferably, the interface would not require the addition of a large number of device pins to the integrated circuit package. It would be of further advantage to have the ability to serially test multiple memory devices with a single ATE interface.

SUMMARY OF THE INVENTION

The problems outlined above are addressed by a system and method for conducting MBIST in a semiconductor memory device using a standard interface. In an embodiment of an integrated circuit described herein, the integrated circuit includes a functional circuit adapted to perform a function associated with the integrated circuit, a self-test circuit adapted to test the functional circuit, and a test interface circuit adapted to initiate testing by the self-test circuit and to receive results from the testing. The self-test circuit includes a plurality of serially linked boundary scan cells, and the test interface circuit includes serial input, serial output, clock, and mode control connections, or ports. The results include test findings, where test findings as used herein are more detailed than simple pass/fail information (referred to herein as a "test outcome"). For example, test findings may include a count of failures found during testing by the self-test circuit, and/or locations of such failures within the circuit.

In further embodiments, the integrated circuit may include a semiconductor memory device. The test interface circuit is preferably compliant with the IEEE 1149.1 standard, or "JTAG-compliant." The self-test circuit may include BIST circuitry adapted to receive a BIST clock signal, and a counter having an input operably coupled to the BIST circuitry and an output operably coupled to the test interface circuit. "Operably coupled" as used herein refers to a connection (either direct or indirect) existing when the circuit or system is operational (e.g., powered up or enabled). The test interface circuit may include a test access port (TAP) controller coupled to the serial input, clock and mode control connections, and a multiplexer adapted to receive output signals from the TAP controller, the counter, and the boundary scan cells. The integrated circuit may further comprise synchronization circuitry adapted to synchronize a high-speed clock signal for the self-test circuit (such as the above-mentioned BIST clock signal) to a clock signal for the test interface circuit (such as a JTAG clock signal).

In a method described herein for testing an integrated circuit, a BIST routine is executed to test a functional portion of the integrated circuit, and test findings are transferred from the integrated circuit through a serial output connection. The serial output connection is associated with an interface that also includes serial input, mode control, and clock connections.

In further embodiments, the integrated circuit may include a semiconductor memory device. Furthermore, the test findings may include a failure count. In such an embodiment, the functional portion may include a semiconductor memory and the failure count may represent a number of failed memory locations. In some embodiments, the functional portion of the integrated circuit may be tested at its full operational speed. The test findings may be transferred from the integrated circuit to an external tester, and may be transferred using a JTAG-compliant interface. This method may correspond to testing the integrated circuit using a rapid testing mode, in which the BIST routine is allowed to operate at full speed.

Alternatively or in addition, a method for testing an integrated circuit as described herein may include executing a BIST routine until a failure is detected at a location within a functional portion of the integrated circuit, and writing the location of the failure to a set of boundary scan cells within the integrated circuit. The location of the failure may then be transferred from the boundary scan cells through the serial output connection, and the execution of the BIST routine resumed. Such an embodiment may correspond to testing of the integrated circuit in a detailed analysis mode. This testing in the detailed analysis mode may be initiated depending on the value of the failure count obtained during testing using the above-described rapid testing mode.

The rapid testing mode described above may also be referred to herein as a "Non-Debug" mode, and the detailed analysis mode as a "Debug" mode. In an embodiment of the Non-Debug mode, the functional circuitry of the integrated circuit may be tested at full operational speed, and a pass/fail result and the number of failures returned at the end of the test. In an embodiment of the Debug mode, testing may be performed at a different (e.g., reduced) speed and the location of all failing memory cells returned at the end of the test.

In addition to the integrated circuit and method described above, a test architecture is described herein. In an embodiment, the test architecture may include multiple semiconductor memory circuits as described above, where each memory circuit includes a memory self-test circuit. The memory circuits are adapted to be coupled together during testing such that test findings from all of the memory self-test circuits may be obtained using a single external tester, without altering the coupling of the tester to the memory circuits.

In further embodiments of the test architecture, each memory circuit may include a test interface circuit adapted to control testing of the corresponding semiconductor memory by the corresponding memory test circuit and receive results from the testing. Each test interface circuit may include serial input, serial output, clock, and mode control ports, and the multiple memory circuits may be linked by one or more test interface connections. In such an embodiment, the test architecture may further include an external tester having a tester interface circuit. The tester interface circuit may be operably coupled to the serial input port of a first memory circuit of the multiple memory circuits, and to the serial output port of a last memory circuit of the multiple memory circuits, and to the clock and mode control ports of all of the memory circuits. The test interface connections are adapted to allow testing of all of the memory circuits without altering the coupling of the tester interface circuit to the memory circuits.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

In some embodiments described herein, a JTAG-compliant interface is used. Issued as IEEE Std. 1149.1 and 1149.1a, the JTAG ("Joint Test Action Group") standard was developed to allow standardized testing of an integrated circuit after it has been assembled onto a printed circuit board. Moreover, the JTAG standard provides for testing numerous integrated circuits on the board as well as the interconnection of those circuits to the printed conductors of the board. In-system testing is therefore provided for testing the entire, assembled printed circuit board using pins associated with a test access port ("TAP"). The term "JTAG-compliant" will be used herein to refer to any device functionally consistent with the IEEE Std. 1149.1 specification.

The JTAG standard calls for the inclusion of diagnostic circuitry with the core logic of the device under test. Among this diagnostic circuitry is a boundary scan register, which functions analogously to a parallel-in/parallel-out shift register. The scan register is capable of applying diagnostic bit patterns ("test vectors") to the inputs of the core logic, and capturing the resulting state of core logic outputs. This feature is quite useful for input/output characterization of many semiconductor devices, but has the disadvantage that the test vectors must be entered and the test results retrieved in serial form. Complete characterization of a memory device typically calls for the creation of a large number of input test vectors, and the inspection of equally many resultant output vectors. Serial transmission of this much data may be prohibitively time-consuming.

Furthermore, the JTAG standard is dissimilar to MBIST circuitry as typically used in memory testing. In general, JTAG testing and MBIST require different sets of pins to interface to a tester. In addition, JTAG testing is quite slow (run at frequencies on the order of 10 MHz) compared to MBIST testing, which may be done at frequencies of 100 MHz and higher. Dissimilarities such as these hamper other approaches to running MBIST using a standard interface. For example, the RUNBIST instruction provided in the JTAG specification allows initiation of full-speed execution of MBIST circuitry within a memory device, and access to a one-bit pass or fail result at the end of the test. However, detailed test results, such as memory fault locations or even the number of faults detected, are not obtainable in this mode. Another approach to MBIST control is a BIST controller such as the memBIST-IC controller available from LogicVision, Inc. of San Jose, Calif. Although this controller may allow access to detailed test results, it uses a non-standard 7-pin interface at the chip level.

By contrast, the method and circuit described herein allow control of MBIST using the standard 4-pin JTAG interface, plus a BIST clock input for the high-speed MBIST testing. In an embodiment, the MBIST and JTAG test circuitry function interactively, such that MBIST execution at full-speed alternates with the slower JTAG retrieval of detailed test results. The method advantageously allows the MBIST circuitry to operate in either of two modes. In the first mode, a rapid testing mode, the MBIST circuitry may test the memory at full speed and return a failure count and a pass/fail verdict (test outcome) through the JTAG interface. In the second mode, a detailed analysis mode, the MBIST circuitry may test the memory at less than full speed and record the location of every faulty memory cell; at the end of the test, these locations may be scanned out through the JTAG interface. Advantageously, the system and method disclosed herein avoid the addition of numerous device pins to the integrated circuit package in order to interface to the MBIST circuitry. Instead, MBIST operation is directed through the JTAG interface. In addition to the standard JTAG complement of 4 pins, MBIST requires one additional pin for a high-speed clock. This circuit and method may allow detailed test information, such as failure counts and failure locations, to be obtained using a four-pin JTAG-compliant interface. Use of the JTAG interface further allows multiple integrated circuits on a board to be connected together and tested using an external tester linked to a single JTAG interface on the board.

Figure 1:
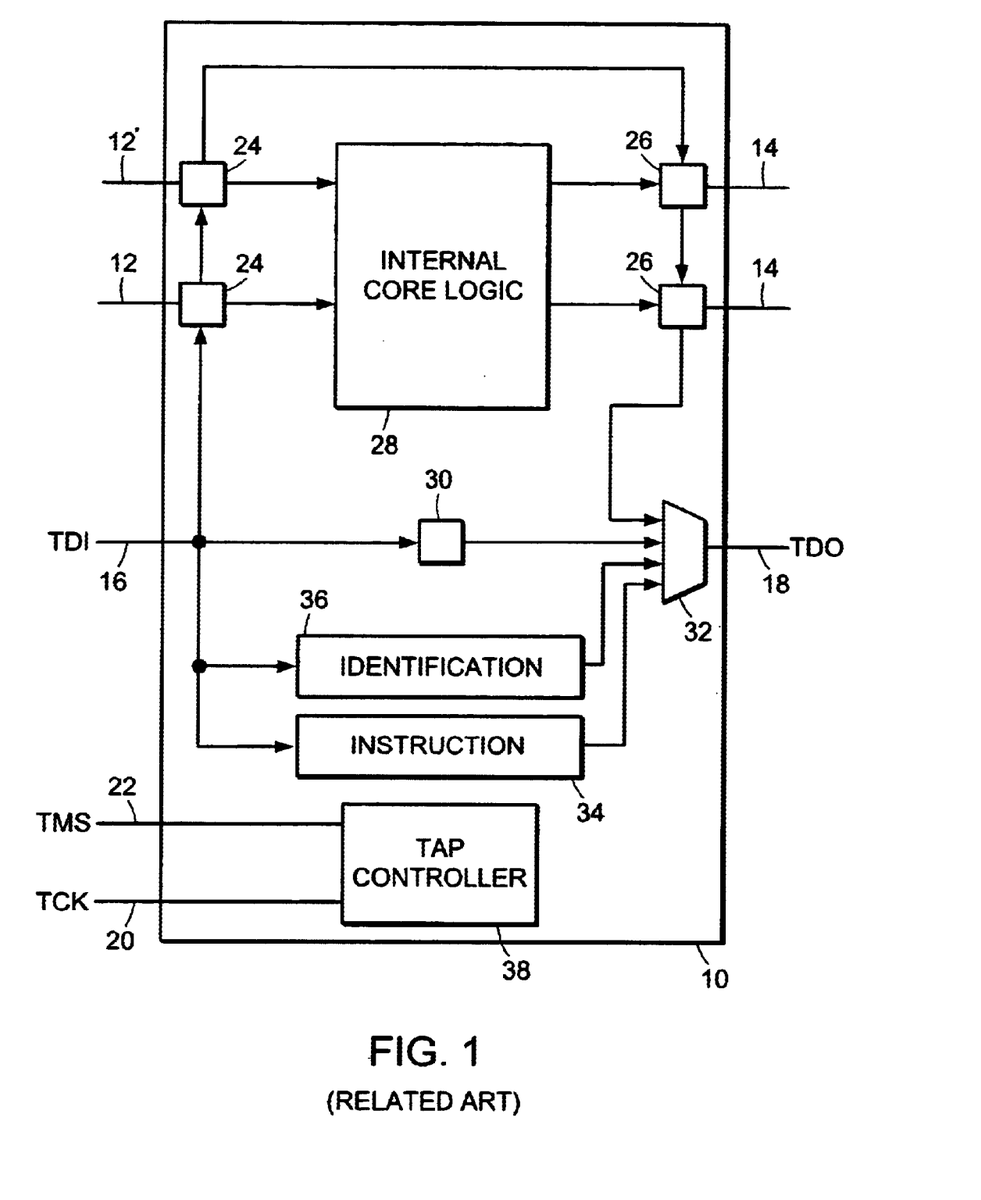
FIG. 1 is a block diagram of a JTAG-compliant integrated circuit, illustrating the relationship between the core logic, input/output pins, the scan elements arranged within the integrated circuit, and a TAP controller.

FIG. 1 is a block diagram of a JTAG-compliant integrated circuit 10 having multiple input 12 and output 14 conductors (pins), and four additional device pins 16, 18, 20, and 22 associated with the JTAG interface. Integrated circuits generally include more than the number of device pins shown. Therefore, FIG. 1 is used only as an abbreviated example so as not to unduly complicate the drawing. A boundary scan register within the integrated circuit consists of multiple input scan cells 24 and output scan cells 26. Also within the integrated circuit is internal core logic 28, which performs the primary device functions of the integrated circuit. Typically, there is a boundary scan cell between every input/output pin of the device and the core logic.

Scan cells 24 connected to input pins 12 may be configured to record inputs to the internal logic; similarly, cells 26 connected to output pins 14 are able to record outputs from the internal logic. It is also possible to configure the scan cells so that data presented at the "Test Data In" (TDI) pin 16 is relayed from cell to cell (in the direction indicated by the solid arrows), ultimately appearing at the "Test Data Out" (TDO) pin 18. Latching and/or shifting of data by the scan cells is synchronized to the "Test Clock" (TCK) input 20. This functionality allows the chain of scan cells to be used to generate test vectors for the integrated circuit, and to probe the state of the internal core logic. For example, a test vector may be created by serially transmitting the desired bit pattern into TDI input 16 and shifting each bit to the appropriate scan cell; an update operation may then be performed to apply the stimulus to the core logic. The operating mode of the cells is controlled by the TAP controller 38, which receives instructions in serial form via "Test Mode Select" (TMS) input 22. (For simplicity, connections between TAP controller 38 and the other JTAG components, such as scan cells 24 and 26, are not shown.)

The JTAG standard permits multiple integrated circuits to be jointly tested. TDI 16 and TDO 18 are daisy-chained through each boundary scan cell 24 and 26, and from integrated circuit to integrated circuit, whereas TCK 20 and TMS 22 are broadcast (i.e., driven in parallel). Prior to entering the first of the daisy-chained integrated circuits, signals upon TDI, TDO, TMS, and TCK of the TAP are typically derived from Automatic Test Equipment (ATE). In some cases, testing may be focused on one particular device among a group of daisy-chained devices. It may then be expedient not to require the JTAG data to propagate through the scan registers of the other devices on its way to the device of interest. Bypass cell 30 allows the signals entering TDI 16 to pass directly to TDO 18, via multiplexor 32, without having to be sequentially shifted through scan cells 24 and 26. Also present within the JTAG-compliant integrated circuit are instruction register 34 and identification register 36. JTAG instructions are 2 or more bits in length. The IEEE Std. 1149.1 specification is deliberately open-ended with regard to what constitutes a valid instruction; this allows considerable freedom for integrated circuit designers to create device-specific instructions for performing diagnostic functions. The identification register 36 may contain a unique device number or code that can be scanned out through the JTAG port to identify a particular device.

IEEE Std. 1149.1 dictates that for an integrated circuit to be JTAG-compliant, all its inputs must be observable and all its outputs must be controllable. The series-connected boundary scan cells (i.e., the scan register) satisfy this requirement by emulating a parallel-in/parallel-out shift register, in which the scan cells are configurable for four modes of operation: normal, capture, scan and update. By operating the scan register in the capture mode, the inputs to the integrated circuit can be recorded in the input scan cells, and the outputs of the integrated circuit can be recorded in the output scan cells. This is analogous to a parallel load operation in a shift register. When the scan register is operated in scan mode, each scan cell relays its contents to the next, in the characteristic manner of a shift register. As shown in FIG. 1, the input to the first stage of this shift register is TDI input 16, and the output of the final stage is TDO output 18. In update mode, the data recorded within each scan cell is presented at its output. This is analogous to a parallel unload operation in a shift register. A particular set of input signals (or, test vector) may be created with which to test the integrated circuit, by serially loading the input scan cells with the appropriate signal for each input of the integrated circuit. As mentioned above, this can be done without interfering with the normal operation of the device. Using scan mode, a test vector may be entered in serial form through the TDI input 16, clocking each bit of the vector through the stages of the scan register to the appropriate cell. Then, an update operation temporarily disconnects the inputs of the internal logic from the input pins and couples them to receive the test vector from the respective cells of the scan register. In a similar manner, the outputs of the internal logic can be recorded (using capture mode) in the scan register and read out of the TDO output 18 in serial form.

The existing IEEE Std. 1149.1 standard provides limited support for interfacing to self-test circuitry. A RUNBIST mode is defined in which a self-test sequence can be initiated through the JTAG port, and a 1-bit pass/fail result scanned out at the end of the test. However, this information is insufficient for diagnostic purposes.

Figure 2:
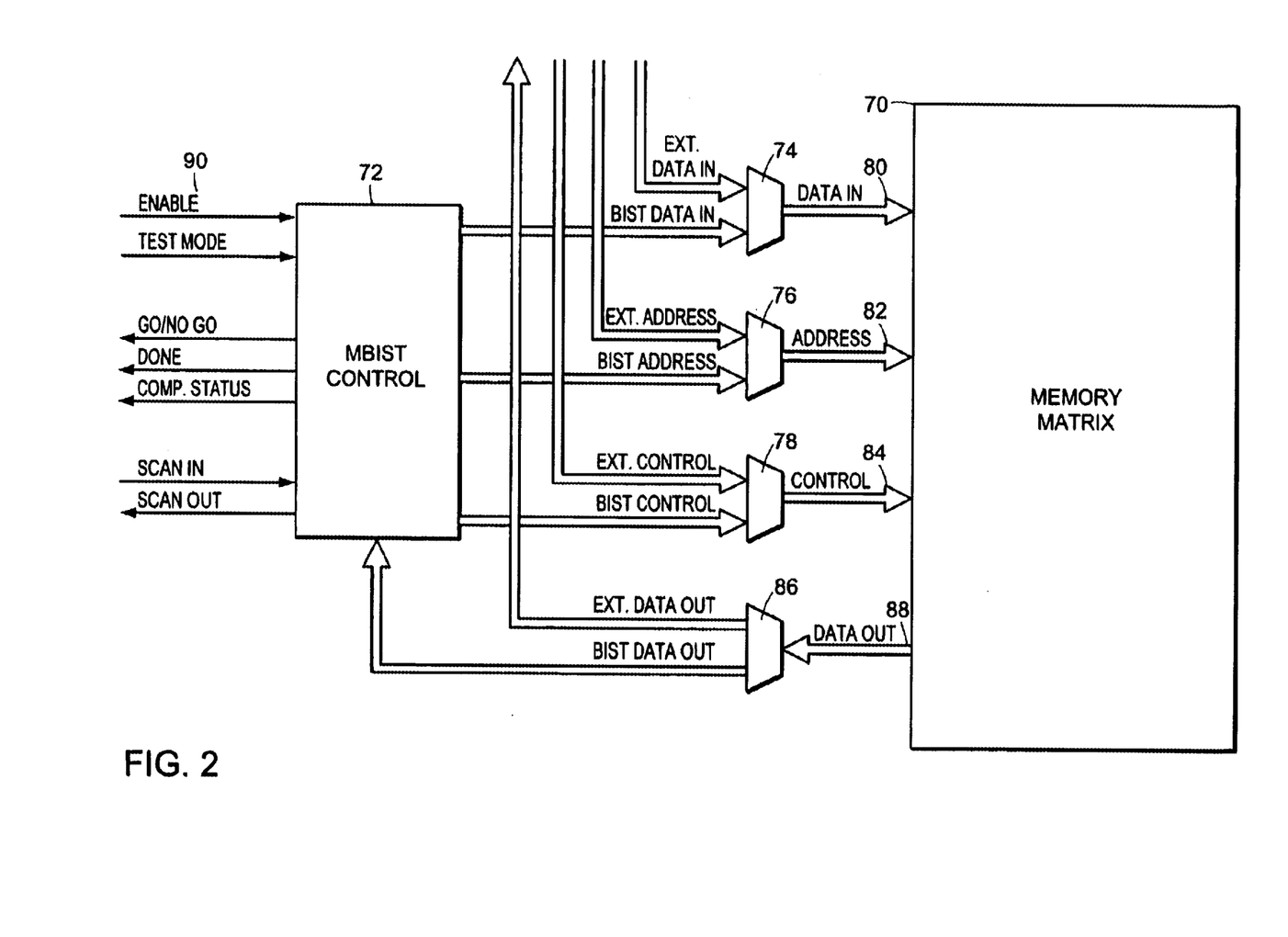
FIG. 2 is an embodiment of an MBIST system for a semiconductor memory device.

Turning now to FIG. 2, an embodiment of an MBIST system for a semiconductor memory device is shown. The MBIST control scheme of FIG. 2 is similar to that available from LogicVision, Inc. The memory matrix 70 within the integrated circuit receives data 80, addresses 82, and control signals 84 and outputs data 88. Inputs 80, 82 and 84 to the memory matrix 70 pass through multiplexers 74, 76 and 78. These multiplexers select either external devices or the MBIST controller 72 as the source for these signals. Similarly, demultiplexer 86 routes the data out 88 from memory matrix 70 to either external devices or MBIST controller 72. The multiplexers and demultiplexer are controlled by a TAP controller. During normal use, the data-in 80, address 82, control 84 and data-out 88 buses are connected to external circuitry, such as a microprocessor. During testing, the multiplexers 74, 76 and 78, and demultiplexer 86 redirect these buses to the MBIST control circuitry. The communications interface 90 for the MBIST controller shown comprises 7 signal lines. This interface may be used by Automated Test Equipment (ATE) to communicate with the MBIST controller, e.g., to send commands, receive test results, etc. Although test results may be scanned out of the MBIST controller, the interface may not be capable of being series-connected with other controllers. Thus, it may not be possible to test multiple interconnected memory devices using a single interface.

In an embodiment of the present method, MBIST circuitry is provided with a JTAG-compliant interface in a semiconductor memory device. The JTAG-controllable MBIST affords several advantages, including fewer device pins dedicated to the interface, and the ability to test multiple interconnected memory devices (or other JTAG-compliant ICs) using a single JTAG communications port. Provision of the JTAG port allows boundary scan diagnostic software running on a personal computer to access the MBIST controller, creating a convenient means by which to coordinate testing and retrieve test results. (An example of such software is the Asset Test Development Station, from Asset Intertech, of Richardson, Tex.)

The MBIST controller in the present method may support both detailed analysis (called, in an embodiment, "DEBUG") and rapid testing (called, in an embodiment, "NONDEBUG") operating modes. Two additional modes of operation, "PARALLEL" mode and "MBIST_TEST" mode may also be available. Selection of one of the test modes is based on a 2-bit Mode Selection Register (MCR) within the TAP controller. In each mode, test commands are sent and test results retrieved using the JTAG communications port.

In the NONDEBUG mode, the memory may be tested at full operating speed. At the end of the test, the controller may return a simple pass/fail result, along with a count of the number of failures detected. These results are obtained from the MBIST controller through the JTAG interface. In the DEBUG mode, on the other hand, the controller may pause the test whenever an error is detected to write the failing memory address and control state information into the scan cells. This information may then be scanned out through the JTAG port, after which DEBUG mode testing resumes. Operation in PARALLEL mode is similar to that of DEBUG mode, except that device outputs may become active whenever a fault is detected by the MBIST, making it possible to trigger diagnostic test equipment. MBIST_TEST mode may perform a self-test of the MBIST test circuitry. In this mode, special logic between the memory and the MBIST circuitry may invert the expected test pattern, to verify that the MBIST will detect the discrepancy.

Figure 3:
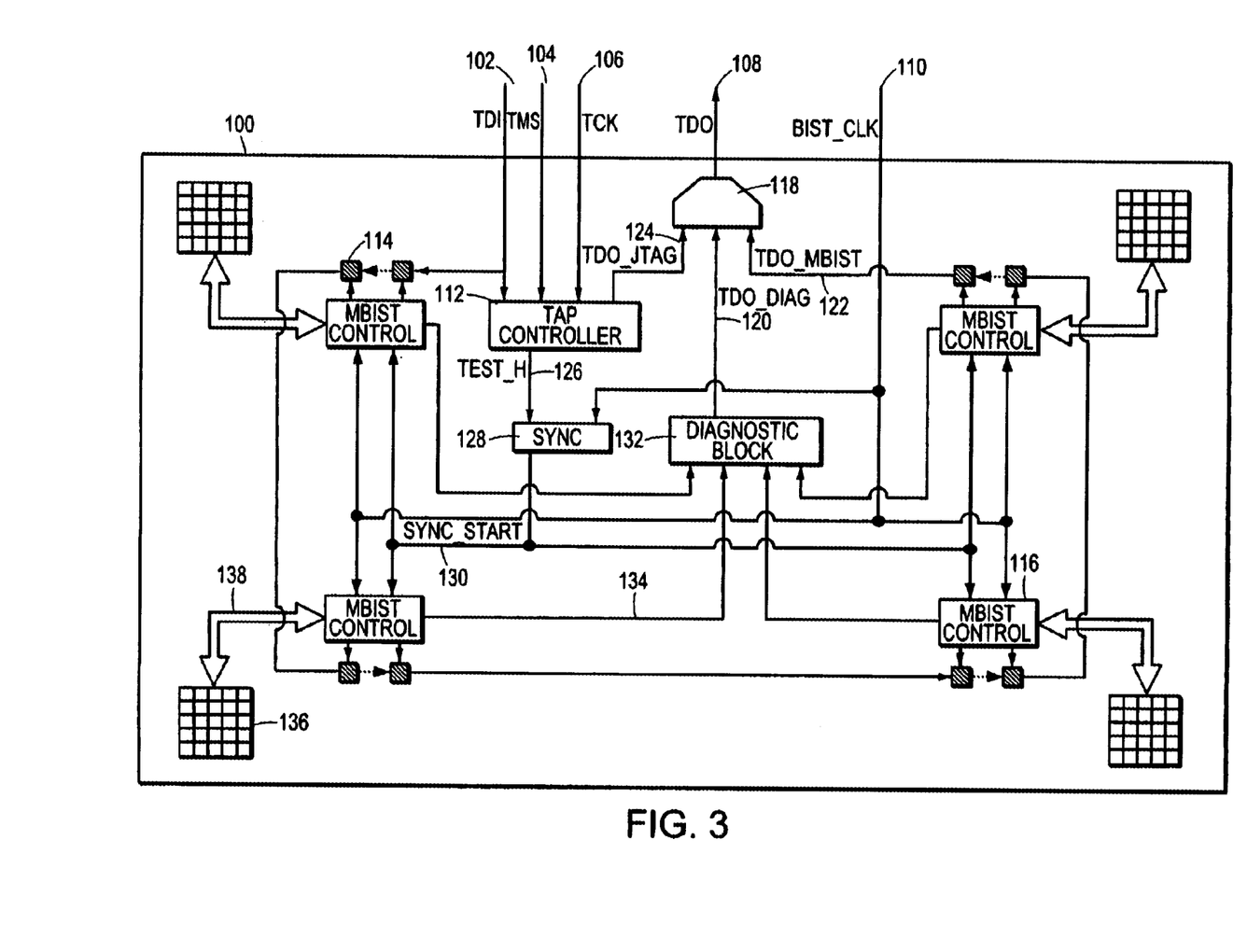
FIG. 3 is a block diagram of an embodiment of an integrated circuit including MBIST capability using a JTAG-compliant interface as described herein.

FIG. 3 contains a block diagram showing an embodiment of the present technique for controlling MBIST circuitry with a JTAG-compliant interface. The following detailed discussion of the method and system disclosed herein refer to this diagram. The integrated circuit 100 in this embodiment is a semiconductor memory device. The four wires of the standard JTAG interface are shown as TDI (Test Data In) 102, TMS (Test Mode Select) 104, TCK (Test Clock) 106 and TDO (Test Data Out) 108. In addition to the four device pins comprising the standard JTAG interface, a high-speed clock input pin BIST_CLK 110 may be provided on the memory device to enable full-speed testing in NONDEBUG mode. In this embodiment of the present system and method, these five signals comprise the communications interface. For simplicity, the other device pins (i.e., address, data, write-enable, etc.) are not shown in FIG. 3.

The above-described signals (except for BIST_CLK 110) are coupled to TAP controller 112, which provides the JTAG-compliant interface to the memory device. Distributed within the integrated circuit is MBIST circuitry, shown in FIG. 3 as separate MBIST controllers 116. Each of the MBIST controllers interfaces to a portion of the memory matrix 136 being tested over a bi-directional bus 138. Series-connected boundary scan cells 114 comprise a scan register. In accordance with the IEEE Std. 1149.1 standard, the scan register can receive serial input from the TDI 102 input, and can shift its contents out through TDO 108 output. The cells of the scan register are also coupled to receive parallel input from the MBIST controllers 116. This provides a means for each MBIST controller to export test results. In DEBUG mode, an MBIST controller may write the location of a faulty memory cell to the adjacent cells of the scan register, following which, the TAP controller may shift the information out serially as TDO_MBIST 122. In NONDEBUG mode, diagnostic block 132, which may contain a counter, may count the number of failures reported by the MBIST controllers 116 over high-speed data paths 134. A pass/fail result, along with the total number of failures may then be scanned out as TDO_DIAG 120. Other JTAG-related output may appear on TDO_JTAG 124. TDO multiplexer 118 selects TDO_JTAG 124, TDO_DIAG 120 or TDO_MBIST 122 as the source for TDO output 108. This selection is determined by the TAP controller 112.

Testing of a semiconductor memory device incorporating the combined JTAG/MBIST capability disclosed herein preferably begins in the NONDEBUG mode. As previously stated, in this mode testing may be performed at the full operational speed of the memory and result in a simple pass/fail verdict, together with a failure count. In an embodiment, the NONDEBUG mode uses the JTAG-compliant "Run BIST" command to place the TAP controller 112 into a run test/idle state. This allows the MBIST controller 116 to run at full speed, using the high-speed clock BIST_CLK 110. A counter in the diagnostic block 132 may be incremented for each error detected by the MBIST. The TAP controller has previously programmed TDO multiplexer 118 to select the output of the diagnostic block (TDO_DIAG) 120, so at the end of the test, the failure count and a 1-bit pass/fail verdict may be scanned out through TDO output 108, using the slower JTAG clock TCK 106.

A memory that fails in the NONDEBUG mode may warrant further testing. For example, it may be necessary to learn the locations of the failed memory cells so that the memory can be repaired. In the DEBUG mode, the JTAG interface may operate interactively with the MBIST controller to collect detailed diagnostic information about the memory. During DEBUG mode testing, multiplexer 118 is programmed to select TDO_MBIST line 122. The TAP controller enters a run test/idle state and initiates DEBUG mode operation of the MBIST controllers. When an MBIST controller encounters a failure, it may write the failing address and related test information to adjacent boundary scan cells and signals the TAP controller. The TAP controller then may temporarily pause the MBIST controller by placing it in a wait state, while the information in the boundary scan cells is shifted out through TDO output 108 by JTAG clock TCK 106. After this information has been scanned out of the JTAG port, the MBIST is reactivated.

In an embodiment, a 100-bit packet is transmitted out of TDO output 108 for every failure encountered during DEBUG mode testing. The packet may comprise header and trailer bits, along with addresses of failing memory locations, MBIST control states, input/output test patterns, etc. Within the packet may be a test_done bit. When the memory test is completed, the test_done bit in the packet is set. This indicates to the ATE or computer that the test has ended.

In both NONDEBUG and DEBUG modes, the high-speed clock BIST_CLK 110 may be synchronized to the JTAG clock TCK 106 by synchronization logic 128. The test_h output 126 from TAP controller 112 may be derived from TCK 106, and gates BIST_CLK 110. This creates a synchronous high-speed clock sync_start 130, which is distributed to each of the MBIST controllers 116. This allows tests to run at the speed of the BIST_CLK 110, while permitting test results to be scanned out at the speed of the slower JTAG clock TCK 106.

With the method and system disclosed herein, MBIST testing may be controlled by the JTAG interface. Therefore, testing of one or more interconnected devices is easily accomplished by relaying test commands and results over serially-connected JTAG ports. Direct access to the MBIST interface of a particular device on a densely populated circuit board is not always practical, due to the proximity of other components or similar physical constraints. The present method overcomes such problems, however, since it is only necessary to form a single JTAG connection to test all the devices in the series. A sequence of serially connected devices may be tested, for example, by connecting the tester to the TDI port of a first device in the series, and the TDO port of the last device in the series, where the devices in between each have their inputs connected to the output of the previous device. The TCK and TMS ports may all be connected together, and to the tester's JTAG interface. Therefore, the combination of JTAG compliance with MBIST facilitates in-circuit testing of semiconductor memories and other integrated circuits.

Figure 4:
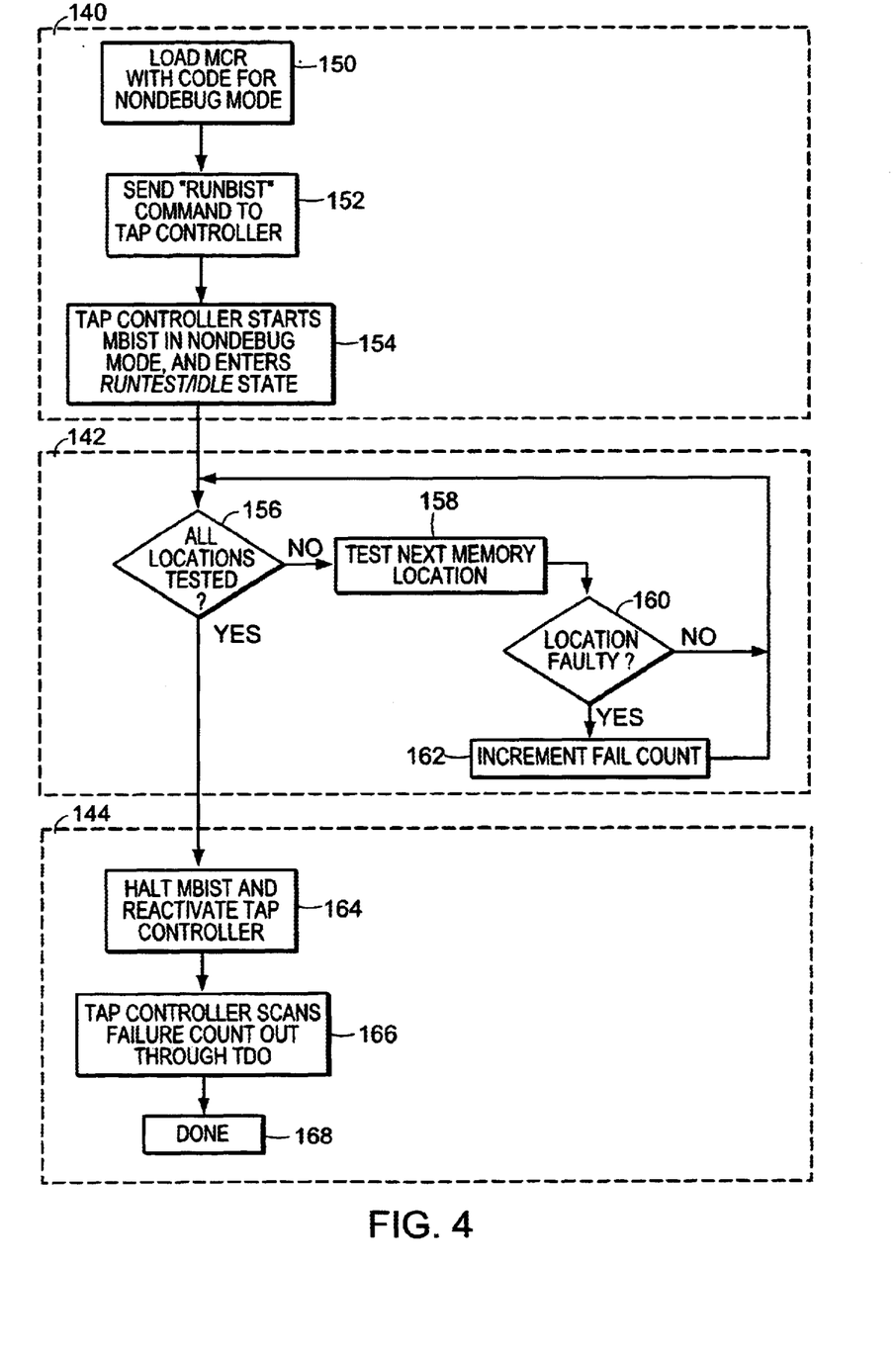
FIG. 4 is a flow chart illustrating a high-speed (rapid testing) test mode embodiment.
Figure 5:
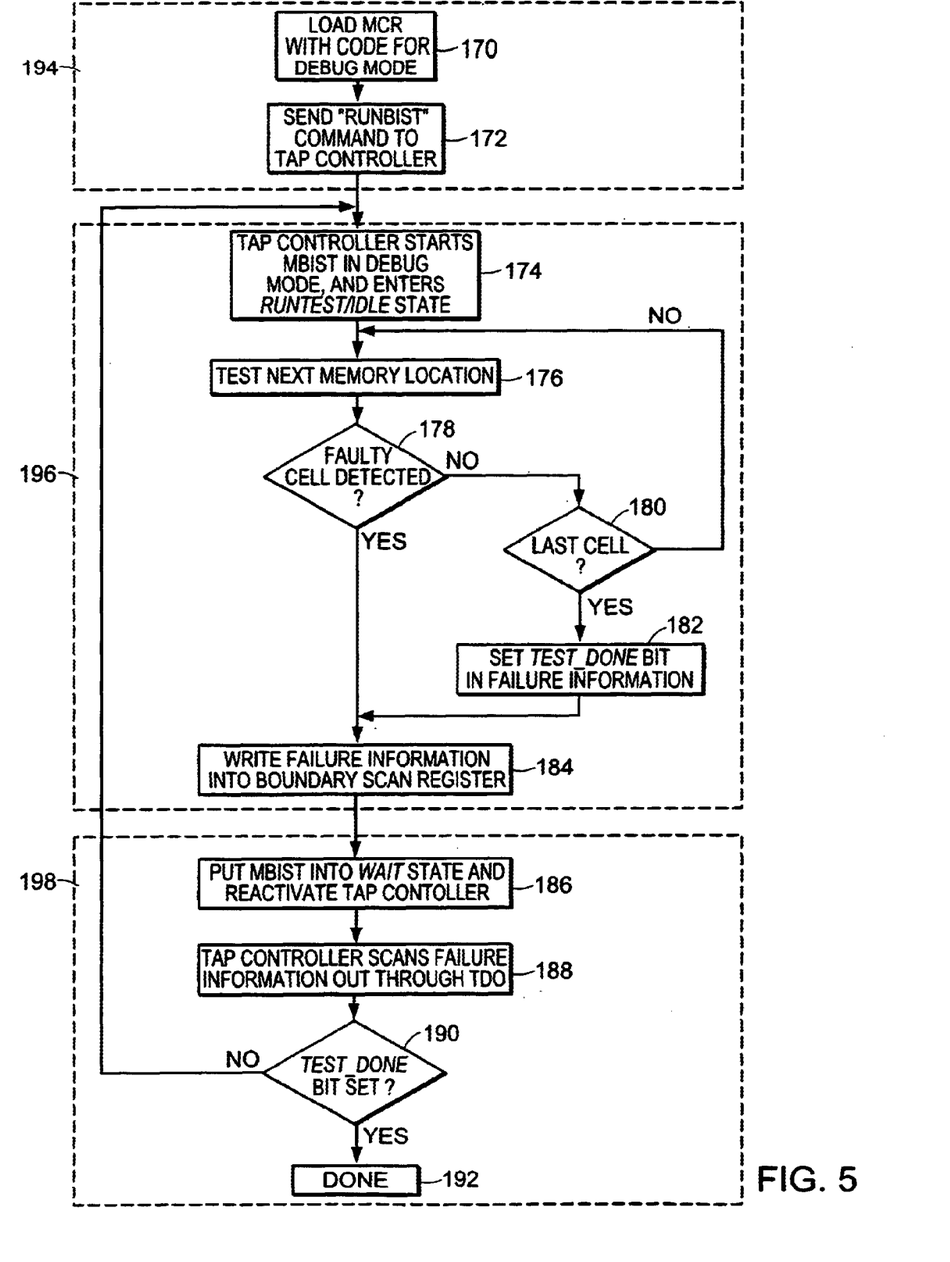
FIG. 5 is a flow chart illustrating a detailed analysis test mode embodiment.

A flowchart depicting the operation of the JTAG-controlled MBIST test method described herein appears in FIGS. 4 and 5. FIG. 4 corresponds to NONDEBUG mode operation, while FIG. 5 represents operation in DEBUG mode. As stated earlier, NONDEBUG mode testing may be performed at the full operational speed of the integrated circuit and returns the number of faults detected and a pass/fail result, without detailed error information. Therefore, it is preferably run before the device is tested in DEBUG mode. Note that the JTAG and MBIST portions of the test circuitry alternate in this test mode. In the first stage 140 and final stage 144 of testing, the TAP controller is active, while in the intermediate stage 142, the MBIST circuitry is active. A test controller, such as an ATE or a computer equipped with a JTAG communications interface, is assumed to be connected to the JTAG port of the memory device(s) being tested. Initially, the test controller issues the instruction code for NONDEBUG mode testing over the TDI input. This code is loaded 150 into the MCR within the TAP controller. When the test controller sends 152 a RUNBIST command, the TAP controller in the memory device responds by starting 154 the MBIST; the TAP controller then enters a runtest/idle state until the MBIST has completed execution. The MBIST controller tests every memory location 156, 158 and 160, and counts 162 the failures. When all the locations have been tested, the MBIST enters a halt state and the TAP controller is reactivated 164. Using the JTAG interface, the test controller scans out 166 the failure count and pass/fail verdict compiled by the MBIST. This completes testing in the NONDEBUG mode 168. If the failure count is greater than zero, but not so great that the memory device irreparable, testing may continue in the DEBUG mode.

As shown in FIG. 5, the JTAG 194, 198 and MBIST 196 functions alternate during DEBUG mode testing, as was the case with NONDEBUG mode. The test controller initiates DEBUG mode testing by issuing the appropriate instruction code over the TDI input, causing it to be loaded 170 in the MCR. The test controller then sends 172 a RUNBIST command. In response, the TAP controller starts 174 the MBIST, and then enters the runtest/idle state. The MBIST controller tests 176 each memory location, until a faulty cell is detected 178. When a bad cell is found, the location of the cell, along with other related information, is written 184 in the form of a 100-bit failure information packet into the boundary scan register. The MBIST sets 182 the test_done bit in the failure information packet when the last memory cell is tested 180. After writing 184 the packet into the boundary scan register, the MBIST enters a wait state, so that the TAP controller can be reactivated 186 long enough to scan out 188 the packet through the TDO output of the JTAG port. The test controller is notified 190 by the test_done bit in the failure information packet when the test is terminated 192; otherwise, the TAP controller returns control 174 to the MBIST, and DEBUG mode testing continues.

It will be appreciated to those skilled in the art having the benefit of this disclosure that the embodiments described are believed applicable to testing semiconductor memories or other integrated circuits, during manufacturing or after these devices have been installed on a printed circuit board. In addition to the modes described above, such as the NONDEBUG and DEBUG modes, the possibility of other MBIST operating modes is recognized and considered within the scope of the present invention. Various architectures, circuitry, and methodologies which may be used to produce the advantages discussed herein are set forth in the claims. Accordingly, the specification and drawings are to be regarded in an illustrative rather than a restrictive sense as to possibly numerous architectures, circuitry, and methodologies which fall within the spirit and scope of the present invention.

What is claimed is:

1. An integrated circuit, comprising
a functional circuit of the integrated circuit, wherein the functional circuit is adapted to perform a function associated with the integrated circuit;
a self-test circuit adapted to test the functional circuit, and comprising a plurality of serially linked boundary scan cells; and
a test interface circuit adapted to initiate testing by the self-test circuit, wherein the test interface circuit comprises:
serial input, serial output, clock and mode control connections; and
a multiplex coupled to receive results from the testing and to send the results to the serial output connection, wherein the results comprise one of a failure count or a failure location depending on an operational mode of the self-test circuit.

2. The integrated circuit as recited in claim 1, wherein the integrated circuit is a semiconductor memory device.

3. The integrated circuit as recited in claim 1, wherein the test interface circuit complies with the IEEE 1149.1 (JTAG) standard, and wherein the serial input connection comprises the JTAG Test Data In (TDI) connection, the serial output connection comprises the JTAG Test Data Out (TDO) connection, the clock connection comprises the JTAG Test Clock (TCK) connection, and the mode control connection comprises the JTAG Test Mode Select (TMS) connection.

4. The integrated circuit as recited in claim 1, wherein the self-test circuit further comprises:
built-in self-test (BIST) circuitry operably coupled to the functional circuit and to the boundary scan cells, wherein the BIST circuitry is adapted to receive a BIST clock signal; and
a counter having an input operably coupled to the BIST circuitry and an output operably coupled to the test interface circuit.

5. The integrated circuit as recited in claim 4, wherein the test interface circuit further comprises:
a test access port (TAP) controller coupled to the serial input, clock and mode control connections; and
the multiplexer, wherein the multiplexer is adapted to receive an output signal from the TAP controller, the failure count from the counter, and the failure location from the boundary scan cells.

6. The integrated circuit as recited in claim 1, wherein the self-test circuit is adapted to be driven by a high-speed clock signal, which is substantially faster than a low-speed clock signal coupled to drive the test interface circuit.

7. The integrated circuit as recited in claim 6, further comprising synchronization circuitry whereby the high-speed clock signal may be synchronized to the low-speed clock signal.

8. The integrated circuit as recited in claim 6, wherein the high-speed clock signal is faster than the low-speed clock signal by at least an order of magnitude.

9. A method for testing an integrated circuit, said method comprising:
testing the integrated circuit using a raped testing mode, wherein said testing comprises:
executing a built-in self-test (BIST) routine to test a functional portion of the integrated circuit;
transferring results from the BIST of the integrated circuit through a serial output connection associated with an interface also comprising serial input, mode control, and clock connections, wherein the results comprise a failure count; and
depending on a value of the failure count, re-testing the integrated circuit using a detailed analysis mode.

10. The method as recited in claim 9, further comprising storing the failure count in a counter within the integrated circuit.

11. The method as recited in claim 9, wherein the integrated circuit comprises a semiconductor memory device, the functional portion comprises a semiconductor memory, and the failure count represents a number of failed memory locations.

12. The method as recited in claim 9, wherein said executing is performed at a speed that enables the functional portion of the integrated circuit to be tested at its full operational speed.

13. The method as recited in claim 9, wherein said transferring comprises transferring the results from the integrated circuit to an external tester.

14. The method as recited in claim 9, wherein said transferring comprises using an interface complying with the IEEE 1149.1 (JTAG) standard, and wherein the serial output connection comprises the test data out (TDO) line of the JTAG standard.

15. The method as recited in claim 9, wherein said re-testing comprises:
re-executing the BIST routine until a failure is detected at a location within the functional portion;
writing the location of the failure to a set of boundary scan cells within the integrated circuit;
transferring the location from the set of boundary scan cells through the serial output connection; and
resuming the re-execution of the BIST routine.

16. The method as recited in claim 15, further comprising suspending the re-execution of the BIST routine during the steps of writing the location and transferring the location.

17. The method as recited in claim 9, wherein said executing a BIST routine is performed at a higher speed than that of said transferring results.

18. A method for testing an integrated circuit, said method comprising:
testing the integrated circuit to obtain a failure count; and
depending on a value of the failure count, re-testing the integrated circuit by:
executing a built-in self-test (BIST) routine to test a functional portion of the integrated circuit, wherein said executing is suspended if a failure is detected at a location within the functional portion;
writing the location of the failure to a set of boundary scan cells within the integrated circuit;
transferring the location from the boundary scan cells through a serial output connection associated with an interface also comprising serial input, mode control, and clock connections; and
resuming execution of the BIST routine.

19. The method as recited in claim 18, wherein the integrated circuit comprises a semiconductor memory device, the functional portion comprises a semiconductor memory, and the location comprises a memory location.

20. The method as recited in claim 18, wherein said transferring comprises using an interface complying with the IEEE 1149.1 (JTAG) standard, and wherein the serial output connection comprises the test data out (TDO) line of the JTAG standard.

21. A test architecture comprising multiple semiconductor memory circuits, wherein each memory circuit includes a memory self-test circuit, and wherein the memory circuits are adapted to be coupled together during testing such that test findings from all of the memory self-test circuits may be obtained using a single external tester, without altering the coupling of the tester to the memory circuits.

22. The test architecture as recited in claim 21, wherein each memory circuit further comprises a test interface circuit adapted to control testing of the corresponding memory circuit by the corresponding memory self-test circuit.

23. The test architecture as recited in claim 21, wherein each test interface circuit complies with the IEEE 1149.1 (JTAG) standard.

* * * * *

UNITED STATES PATENT AND TRADEMARK OFFICE
CERTIFICATE OF CORRECTION

PATENT NO. : 6,681,359 B1
DATED : January 20, 2004
INVENTOR(S) : Au et al.

It is certified that error appears in the above-identified patent and that said Letters Patent is hereby corrected as shown below:

Column 11,
Line 2, please insert -- : -- after "comprising.".
Line 14, please delete "multiplex" and substitute therefor -- multiplexer --.
Line 59, please delete "raped" and substitute therefor -- rapid --.

Signed and Sealed this

Thirteenth Day of September, 2005

JON W. DUDAS
*Director of the United States Patent and Trademark Office*